United States Patent [19]
Lambert et al.

[11] Patent Number: 4,853,077
[45] Date of Patent: Aug. 1, 1989

[54] PROCESS FOR THE PREPARATION OF MONO-CRYSTALLINE 3-5 SEMI-INSULATING MATERIALS BY DOPING AND USE OF THE SEMI-INSULATING MATERIALS THUS OBTAINED

[75] Inventors: Bertrand Lambert; Yves Toudic, both of Lannion; René Coquille, Trelevern, all of France

[73] Assignee: Etat Francais, Issy Les Moulineaux, France

[21] Appl. No.: 35,979

[22] Filed: Apr. 8, 1987

[30] Foreign Application Priority Data

Apr. 8, 1986 [FR] France ............................. 86 05000

[51] Int. Cl.⁴ ............................................. C30B 15/04
[52] U.S. Cl. ................................... 156/605; 156/607; 156/616.1; 156/616.2; 156/617.1; 156/626.2; 156/DIG. 70; 156/DIG. 75; 156/DIG. 81; 156/DIG. 82; 437/115
[58] Field of Search ................... 156/605, 607, 616 A, 156/617 SP, 616 R, DIG. 70, DIG. 75, DIG.81, DIG. 82; 148/DIG. 23, DIG. 33, 617.1, 616.1, 616.2, 620.2; 437/115

[56] References Cited

U.S. PATENT DOCUMENTS

| 3,344,071 | 9/1967 | Cronin | 156/605 |
| 3,585,087 | 6/1971 | Blum et al. | 156/605 |
| 4,158,851 | 6/1979 | Akai et al. | 252/62.3 GA |
| 4,299,650 | 11/1981 | Bonner | 156/617 SP |

FOREIGN PATENT DOCUMENTS

| 0149898 | 7/1985 | European Pat. Off. | 156/605 |
| 1409116 | 7/1965 | France | 156/605 |
| 61-155296 | 7/1986 | Japan | 156/617 SP |
| 1339564 | 12/1973 | United Kingdom | 156/607 |

OTHER PUBLICATIONS

Bachman et al., Liquid Encapsulated Czochralski Pulling of InP Crystals, Journal of Electronic Materials, vol. 4, No. 2, Apr. 1975, pp. 389–406.

Primary Examiner—John Doll
Assistant Examiner—Robert M. Kunemund
Attorney, Agent, or Firm—Gifford, Groh, Sheridan, Sprinkle and Dolgorukov

[57] ABSTRACT

The present invention relates to a process for the preparation of mono-crystalline 3-5 semi-insulating materials by doping, characterized in that the starting charge of type $p$ is doped with at least one deep donor due to a transition element. It relates also to the use of the semi-insulating materials obtained in the fields of optoelectronics and of rapid electronics.

10 Claims, No Drawings

PROCESS FOR THE PREPARATION OF MONO-CRYSTALLINE 3-5 SEMI-INSULATING MATERIALS BY DOPING AND USE OF THE SEMI-INSULATING MATERIALS THUS OBTAINED

BACKGROUND OF THE INVENTION

1. Field of the Invention

The present invention relates to a process for the preparation of mono-crystalline 3-5 semi-insulating materials by doping and the use of the semi-insulating materials so-obtained.

DESCRIPTION OF THE PRIOR ART

In the field of semi-conductors, it is known to produce mono-crystals, by growth from a seed, by the known methods of LEC drawing, or of Bridgman growth.

Numerous problems arise however, in the production of semi-insulating substrates (s-i). In fact, the doping substances proposed until now have not been shown to be satisfactory, due to the fact in particular of the value of their diffusion coefficient. This is the case for E.L.2 in the case of GaAs, and of Fe in the case of InP.

SUMMARY OF THE PRESENT INVENTION

These problems are resolved according to the invention by carrying out doping with at least one deep donor. The process according to the invention enables the production of semi-insulating materials both from a starting charge of p type and from n type.

Thus, the present invention relates to a process for the preparation of mono-crystalline 3-5 semi-insulating materials by doping, characterized in that the starting charge of p type is doped with at least one deep donor due to a transition element.

DETAILED DESCRIPTION OF THE PREFERRED EMBODIMENT OF THE PRESENT INVENTION

A binary compound of conventional p type is GaAs; undoped GaAs specimens are p type residuals, obtained by drawing. Doping of such specimens by a deep donor enables these p type specimens to be compensated and enables them to be made semi-insulating.

Among 3d transition metals, according to the invention, it is preferred to use this doping, titanium and/or chromium, which give deep donor levels.

Thus, the doping and growth of specimens of s-i GaAs doped with Cr or with Ti has been carried out.

In the case most frequently encountered, where the specimen is of the residual n type—which is the case for example, of InP specimens—according to the invention, doping is effected in addition of the starting charge and/or the mono-crystal, previously doped with a deep donor, with at least one acceptor. This co-doping enables a specimen originally of n type to be rendered p type, by suitable doping with an acceptor. The n type crytal, rendered p type by doping, will be rendered semi-insulating by the introduction of at least one second deep donor doping substance.

This co-doping method is particularly interesting in the case InP, although it is possible to produce by this method 3-5 semi-insulating substances from other binary substrates.

As an acceptor according to the invention, it is possible to envisage any acceptor having an acceptable segregation coefficient, a limited solubility in the apropriate substrate and good heat stability. The acceptors cadmium and mercury are particularly suitable. The holes which arise from doping with this acceptor are trapped by the deep donor, for example Cr or Ti.

Thus, the co-doping and growth of speeimens of s-i InP co-doped with Cd-Cr, Hg-Cr, Hg-Ti or Cd-Ti has been performed.

Thus, a residual starting bath of type n ($N_D - N_A \approx 5.10^5 cm^{-3}$) doped with an acceptor (Cd or Hg) to a concentration a little higher ($10^{16} cm^{-3}$ for example) wil be rendered semi-insulating by a deep donor co-doping substance (Ti or Cr), in sufficient amount to compensate the acceptors.

In order to guarantee the constancy of the resistivity between the head and the tail of the mono-crystal during growth, account must be taken of the segregation coefficients of the doping substances to provide for their concentrations in the bath.

For Hg, Applicant has been able to establish a segregation coefficient close to 1. In the same way—for the acceptor Cd, the segregation coefficient is in the vicinity of 1, of the order of 0.5. In the case of doping with these two acceptors, the doping is practically identical at the head and tail of the crystal, as well as in the starting bath, namely about $10^{16} cm^{-3}$.

On the other hand, the chromium donor has a segregation coefficient of the order of $3.10^{-4}$; the chromium is added to a concentration of $10^{16}$, namely $3.3, 10^{19}$ into the starting bath, and the Cr doping increases, the resistivity increasing from the head to the tail of the crystal.

To produce such crystals, conventional growth methods are used, in particular the LEC drawing method and the Bridgman method.

When the LEC method is employed, in the case of InP co-doping in particular, the dopant impurities are introduced generally at the same time as the starting charge in the form of chromium, of titanium, of cadmium or of mercury introduced into the starting bath before drawing. However doping impurities which are too volatile cannot be introduced during drawing.

It is then possible in addition to introduce the doping impurities like Hg or Cd into the starting charge itself, by using a polycrystal pre-doped with one of the dopants.

The semi-insulating substances obtained are particularly useful in the fields of optoelectronics and rapid electronics. They permit, in particular, the manufacture of substrates for epitaxy. This is why, the present invention relates to the use of the semi-insulating materials prepared according to the invention in these fields.

Other advantages and characteristics of the invention will appear on reading the following examples.

EXAMPLE 1

Cadium-chromium co-doping on InP.

Crystals of InP co-doped with Cd-Cr have been produced by the LEC drawing method (Czochralski drawing under liquid encapsulation). To a poly-crystalline InP charge of 496 g, having a residual concentration $N_D$-$N_A$ of 5 to $7.10^{15} cm^{-3}$, were added 277 mg of chromium. There was placed in a silicon crucible or in PBN the polycrystalline charge of InP, the chromium and 10 g of InP highly doped with cadmium ($1.5.10^{18}$ atoms $cm^{-3}$) then the $B_2O_3$ disc (encapsulating liquid).

The whole is heated in the drawing vessel, under a pressure of 50 bars of nitrogen, until the melting of the InP (1063° C.).

Then the drawing is carried out at a speed of about 1.5 cm/h in the direction <001>.

The crystal obtained is semi-insulating, it has the following electrical characteristics:

$\rho = 10^4 \Omega cm$ to 400° K.

EXAMPLE 2

Mercury-titanium co-doping on InP;

By the same method as in Example 1, crystals of InP co-doped with Hg-Ti were produced.

The starting charge consisted of 500 g of a polycrystalline charge of InP already doped with mercury ($10^{16}$ atoms cm$^{-3}$) to which 250 mg of titanium was added.

The crystal was drawn in the direction <001>.

The crystal obtained possessed the following resistivity:

$\rho = 3.8 \cdot 10^2 \Omega cm$ to 400° K.

We claim:

1. Process for the preparation of mono-crystalline 3-5 semi-insulating material by doping, comprising doping the starting charge of type p with at least one deep donor due to a transition element, wherein the starting charge or the mono-crystal previously doped with a deep donor is doped with at least one acceptor, and wherein the acceptors are selected from among Cd and/or Hg.

2. Process for the preparation of mono-crystalline 3-5 semi-insulating material by doping, comprising doping the starting charge of type p with at least one deep donor due to a transition element, wherein the starting charge or the mono-crystal previously doped with a deep donor is doped with at least one acceptor, and wherein a starting InP charge is co-doped with Cd and Cr, or with Hg and Cr.

3. Process for the preparation of mono-crystalline 3-5 semi-insulating material by doping, comprising doping the starting charge of type p with at least one deep donor due to a transition element, wherein the starting charge or the mono-crystal previously doped with a deep donor is doped with at least one acceptor, and wherein an InP starting charge is co-doped with Cd and Ti, or with Hg and Ti.

4. Process according to claim 1 wherein the starting charge comprises GaAs or InP.

5. Process according to claim 1 wherein the deep donors are selected from among Ti and/or Cr.

6. Method of using semi-insulating materials obtained by the process according to claim 1 in the field of opto-electronics and of rapid electronics.

7. Process according to claim 1, wherein said process is carried out by an LEC drawing or Bridgman method.

8. Process for the preparation of mono-crystalline 3-5 semi-insulating material by doping, comprising doping the starting charge of type p with at least one deep donor due to a transition element, wherein the starting charge or the mono-crystal previously doped with a deep donor is doped with at least one acceptor, and wherein the acceptors are selected from the ones whose segregation coefficients are in the vicinity
    wherein the acceptors are selected from among Cd and/or Hg.

9. Process for the preparation of mono-crystalline 3-5 semi-insulating material by doping, comprising doping the starting charge of type p with at least one deep donor due to a transition element, wherein the starting charge or the mono-crystal previously doped with a deep donor is doped with at least one acceptor, and wherein the acceptors are selected from the ones whose segregation coefficients are in the vicinity of one;
    wherein a starting InP charge is co-doped with Cd and Cr, or with Hg and Cr.

10. Process for the preparation of mono-crystalline 3-5 semi-insulating material by doping, comprising doping the starting charge of type p with at least one deep donor due to a transition element, wherein the starting charge or the mono-crystal previously doped with a deep donor is doped with at least one acceptor, and wherein the acceptors are selected from the ones whose segregation coefficients are in the vicinity of one;
    wherein an InP starting charge is co-doped with Cd and Ti, or with Hg and Ti.

* * * * *